(12) United States Patent
Kono

(10) Patent No.: US 6,521,992 B2
(45) Date of Patent: Feb. 18, 2003

(54) SEMICONDUCTOR APPARATUS

(75) Inventor: Eiji Kono, Aichi-ken (JP)

(73) Assignee: Kabushiki Kaisha Toyoda Jidoshokki Seisakusho, Kariya (JP)

(*) Notice: Subject to any disclaimer, the term of this patent is extended or adjusted under 35 U.S.C. 154(b) by 0 days.

(21) Appl. No.: 09/835,713

(22) Filed: Apr. 16, 2001

(65) Prior Publication Data
US 2002/0011350 A1 Jan. 31, 2002

(30) Foreign Application Priority Data
Apr. 21, 2000 (JP) ........................ 2000-120964

(51) Int. Cl.⁷ ............... H01L 31/111; H01L 23/495; H01L 23/52; H01L 23/34
(52) U.S. Cl. .............. 257/723; 257/587; 257/777; 257/666; 257/135; 257/151; 257/690; 257/691; 257/728; 257/177
(58) Field of Search ................ 257/587, 723, 257/777, 666, 135, 151, 690, 691, 728

(56) References Cited

U.S. PATENT DOCUMENTS 3,784,884 A * 1/1974 Zoroglu .................. 317/234
5,371,405 A * 12/1994 Kagawa .................. 257/664

FOREIGN PATENT DOCUMENTS

| JP | 59-184551 | * 10/1984 |
| JP | 360037170 | * 2/1985 |
| JP | A-05-206449 | 8/1993 |
| JP | 406291251 | * 10/1994 |
| JP | A-07-249735 | 9/1995 |

* cited by examiner

Primary Examiner—David E. Graybill
Assistant Examiner—James Mitchell
(74) Attorney, Agent, or Firm—Woodcock Washburn LLP

(57) ABSTRACT

An electrode wiring structure is disclosed which realizes a semiconductor apparatus as a power semiconductor module with the current path set as shortest as possible and uniformly. The semiconductor apparatus includes: a plurality of semiconductor devices mounted in one array or more on a substrate; a main current electrode mounted along the array (s) of the semiconductor devices, and commonly connected to each of the plurality of semiconductor devices through the substrate. The substrate is connected to the main current electrode through a plurality of wires arranged along the array(s) at equal or substantially equal distances.

5 Claims, 5 Drawing Sheets

SEMICONDUCTOR APPARATUS

BACKGROUND OF THE INVENTION

1. Field of the Invention

The present invention relates to a semiconductor apparatus used mainly as a switching device in, for example, a motor drive device in an inverter, an AC servomotor, an air conditioner, etc., or a power supply device in a vehicle, a welding machine, etc., and more specifically to the improvement of an electrode wiring structure in a semiconductor apparatus applicable as a power semiconductor module.

2. Description of the Related Art

Normally, a semiconductor module can be, for example, a plurality of semiconductor devices (semiconductor chips) connected in parallel to have a larger current capacity, a simple circuit of several types of semiconductor devices, semiconductor devices into which a drive circuit is incorporated, etc.

FIG. 1 is a plan view of an example of a conventional power semiconductor module.

In the semiconductor module shown in FIG. 1, an insulated substrate 2 is mounted on a base plate 1 for fixing. On the insulated substrate 2, a plurality of (four as an example shown in FIG. 1) semiconductor devices (semiconductor chips) 4 are mounted in series through a conductive plate 3. In this example, the semiconductor device 4 is a MOSFET (metal oxide semiconductor field-effect transistor) having a source electrode and a gate electrode on the top side, and a drain electrode on the reverse side.

The conductive plate 3 is electrically connected commonly to the drain electrode of each semiconductor device 4 by mounting the semiconductor device 4 directly on it, thereby functioning as a drain electrode of the entire module. On the insulated substrate 2, a source electrode 5 and a gate electrode 6 of the entire module are mounted along the array of the semiconductor devices 4 and on either side of the conductive plate 3.

The source electrode 5 is electrically connected commonly to the source electrode of each semiconductor device 4 through a wire (bonding wire) 7, and the gate electrode 6 is electrically connected commonly to the gate electrode of each semiconductor device 4 through a wire (bonding wire) 8. A gate resistor such as a silicon chip resistor, etc. can be provided on the gate electrode 6, and the wire 8 can be connected thereto.

Furthermore, a drain terminal 9 is led outside the module as an external terminal from a portion of the conductive plate (drain electrode) 3, a source terminal 10 is led outside the module as an external terminal from a portion of the source electrode 5, and a gate terminal 11 is led outside the module as an external terminal from a portion of the gate electrode 6.

Although not shown in the attached drawings, the entire module is normally put in a resin package, and the space in the package is filled with gel or epoxy resin, etc. The above mentioned external terminal is drawn in a two-dimensional array in FIG. 1, but it is appropriately bent and exposed on the top or side of the package.

The semiconductor module with the above mentioned configuration has a plurality of semiconductor devices 4 connected in parallel between the drain terminal 9 and the source terminal 10. Therefore, in principle, the main current flowing between the drain terminal 9 and the source terminal 10 can be controlled by applying a control voltage between the gate terminal 11 and the source terminal 10, and simultaneously setting all semiconductor devices 4 ON/OFF.

In the conventional semiconductor module as shown in FIG. 1, restrictions are placed by the gate electrode 6 especially on the wiring pattern from the drain electrode (conductive plate) 3 to the drain terminal 9. That is, the drain terminal 9 is led outside through the path from the end portion of the conductive plate 3 without passing the gate electrode 6.

Therefore, the lengths of the current paths are entirely long as indicated by the dot-and-dash line as shown in FIG. 2 when the main current flows from the drain terminal 9 to the source terminal 10 through each semiconductor device 4, and the lengths are uneven depending on the position of each semiconductor device 4. Especially, the current path through the semiconductor device 4 shown in FIG. 1 on the right is considerably longer than the current path through the semiconductor device 4 on the left.

Since the inductance generated in the current path is substantially proportional to the length of the path, the inductance increases correspondingly when the current path is long as described above. As a result, the surge voltage generated when the semiconductor device 4 is turned off rises, thereby possibly destroying the semiconductor device 4.

In addition, when the lengths of current paths are not even, the wiring resistance also becomes uneven depending on the position of each semiconductor device 4. As a result, the current value becomes unbalanced, thereby leading excess current through only a part of the semiconductor devices 4, and also possibly destroying the semiconductor devices 4. Therefore, with the problem of the above mentioned excess current to a part of the semiconductor devices 4 has prevented the maximum current through the module from largely increasing.

Furthermore, with the drain terminal 9 directly connected to the conductive plate 3 to be mounted on the insulated substrate 2 as the semiconductor module as shown in FIG. 1, there can easily be a crack in the joint (the portion encompassed by a circle A indicated by a dot-and-dash line) between the drain terminal 9 and the conductive plate 3 due to the expansion and contraction by the heat from the semiconductor devices 4.

To prevent the above mentioned cracks, the drain terminal 9 can be connected through a plurality of wires (bonding wires) instead of directly connecting them. That is, in FIG. 1, the joint portion (indicated by the dot-and-dash circle A) can be separated and replaced with a plurality of wires.

With the above mentioned configuration, cracks can certainly be suppressed. However, the above mentioned problems of the lengths and unevenness of the current paths still remain unsolved. These problems become severer with an increasing number of semiconductor devices 4 mounted on one insulated substrate 2.

SUMMARY OF THE INVENTION

An object of the invention is to solve the above mentioned problems with the conventional technology, and to provide a semiconductor apparatus capable of not only suppressing cracks, but also shortening and leveling the lengths of the current paths, reducing a surge voltage, and improving the maximum current in the apparatus.

To attain the above mentioned object, the present invention has the following configuration.

That is, the semiconductor apparatus according to the present invention includes: a plurality of semiconductor devices mounted in one or more arrays on a substrate; a first main current electrode mounted along the array(s) of the semiconductor devices, and commonly connected to each of the plurality of the semiconductor devices though the substrate; and a second main current electrode mounted along the array(s) of the semiconductor devices opposite the first main current electrode through the mounting area of the semiconductor devices, wherein the substrate is connected to the first main current electrode through a plurality of wires arranged at equal (or substantially equal) distances along the array(s).

The substrate can be a conductive plate or a conductive layer mounted on an insulated substrate. However, it is obvious that other configurations can be accepted only if a path of the main current flowing from the main current electrode to each of the semiconductor devices can be provided.

The above mentioned main current electrode is a drain electrode or a source electrode when the semiconductor device is, for example, a MOSFET. It also can be a collector electrode or an emitter electrode when the semiconductor device is, for example, a bipolar transistor. Although the second main current electrode is to be directly connected to each of the semiconductor devices mounted on the substrate through wires (bonding wires), etc. On the other hand, the first main current electrode is to be indirectly connected to each of the semiconductor devices through the substrate. That is, it is to be connected to the substrate through the wires to form the current path of the main current from the first main current electrode to each of the semiconductor devices through the wires and the substrate.

According to the present invention, the first and second main current electrodes are respectively arranged along the array(s) of the semiconductor devices and on each side of the mounting area of the semiconductor devices, and the substrate is connected to the main current electrode through a plurality of wires mounted at equal (or substantially equal) distances along the array(s) of the semiconductor devices.

It is not always necessary that the plurality of wires are equally arranged, that is, arranged at equal distances, but they are to be arranged at substantially equal distances. For example, when a predetermined number (two, for example) of wires are arranged corresponding to each semiconductor device, they are not arranged at equal distances in the entire module, but in the range of the arrangement at 'substantially equal' distances.

With the above mentioned configuration, the first main current electrode is actually connected to the substrate through a plurality of wires. However, since the plurality of wires are arranged along the array(s) of the semiconductor devices, the first main current electrode is practically connected to the substrate directly on their sides (plane along the array(s) of the semiconductor devices). Therefore, the main current flows substantially straight from the first main current electrode to each semiconductor device through the substrate, and further to the second main current electrode.

Thus, since the current path of the main current is formed substantially straight from the first main current electrode to the second main current electrode regardless of the position of each semiconductor device, the current path can be considerably shorter, and is leveled. As a result, the inductance can be reduced, and the surge voltage can be suppressed, thereby leveling the main current flowing through each semiconductor device, and increasing the maximum current in the entire semiconductor apparatus (semiconductor module).

Furthermore, the first main current electrode is not actually connected directly to the substrate, but is indirectly connected through wires, thereby suppressing the generation of cracks in the joint portions due to the expansion and contraction of the semiconductor devices.

With the above mentioned configuration, it is desired that the wires connecting the first main current electrode to the substrate is shortest possible, but long enough to connect them.

Furthermore, it is desired that the first external terminal led outside from the first main current electrode and the second external terminal led outside from the second main current electrode are opposite each other through the mounting area of the semiconductor devices.

The present invention has a unique connection structure between the substrate and the first main current electrode, and the connection structure between the second main current electrode and each semiconductor device is not limited to a specific structure. However, it is desired that the entire current path from the first main current electrode to the second main current electrode is as straight as possible.

DESCRIPTION OF THE PREFERRED EMBODIMENTS

The embodiments of the present invention are described below in detail by referring to the attached drawings.

First Embodiment of the Present Invention

Figure 1:
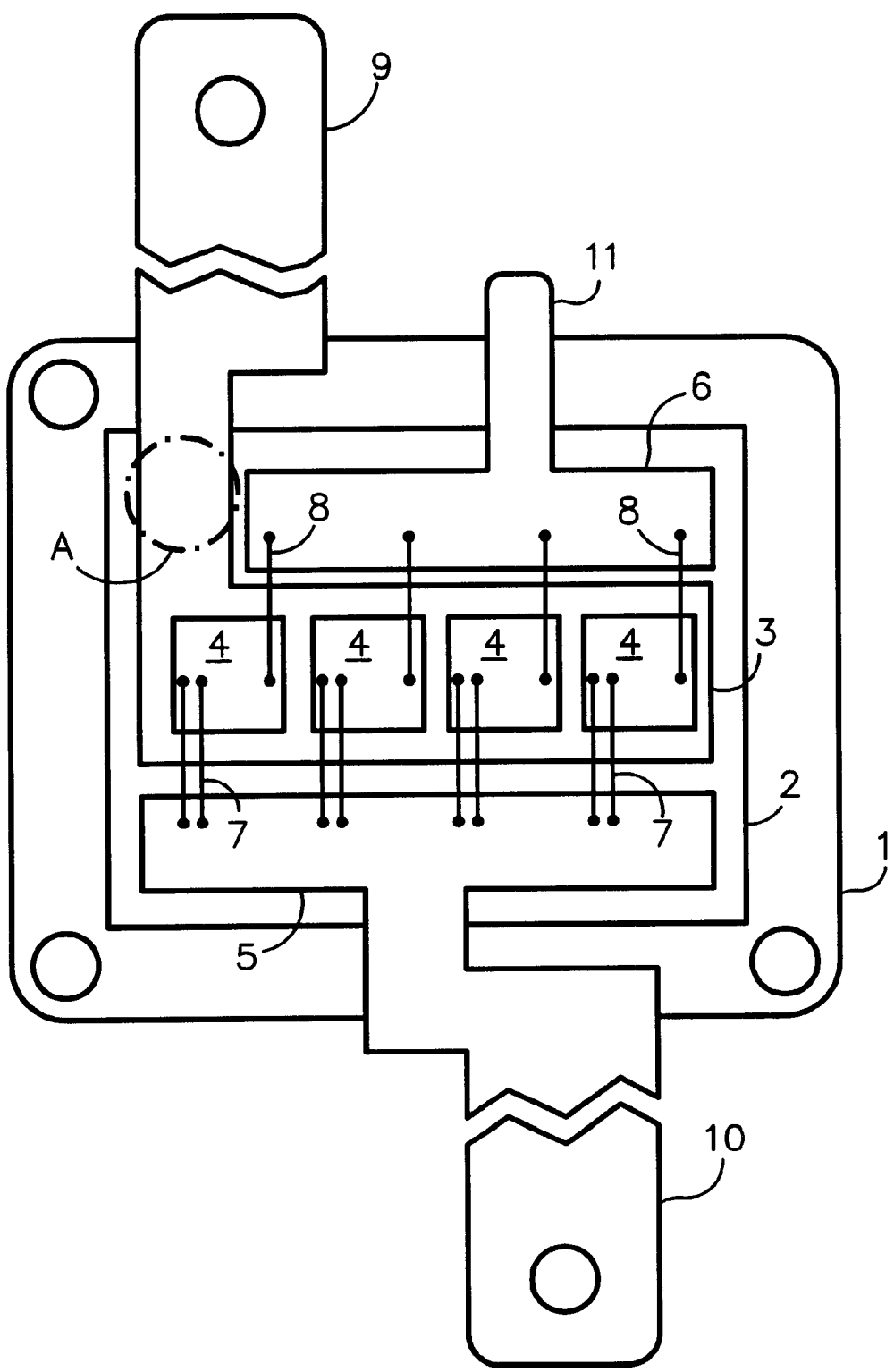
FIG. 1 is a plan view of the conventional power semiconductor module.
Figure 2:
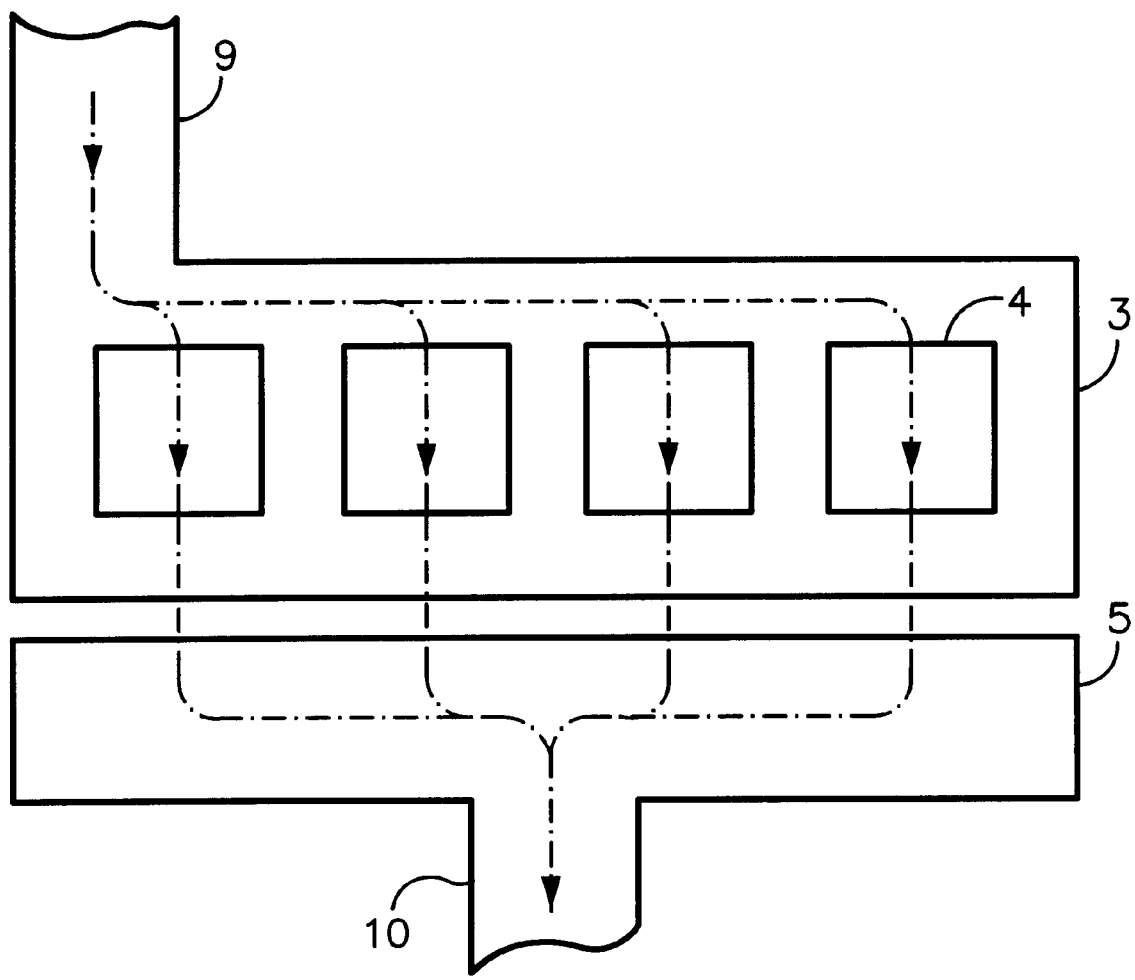
FIG. 2 shows a current path of the main current in the conventional power semiconductor module.
Figure 3:
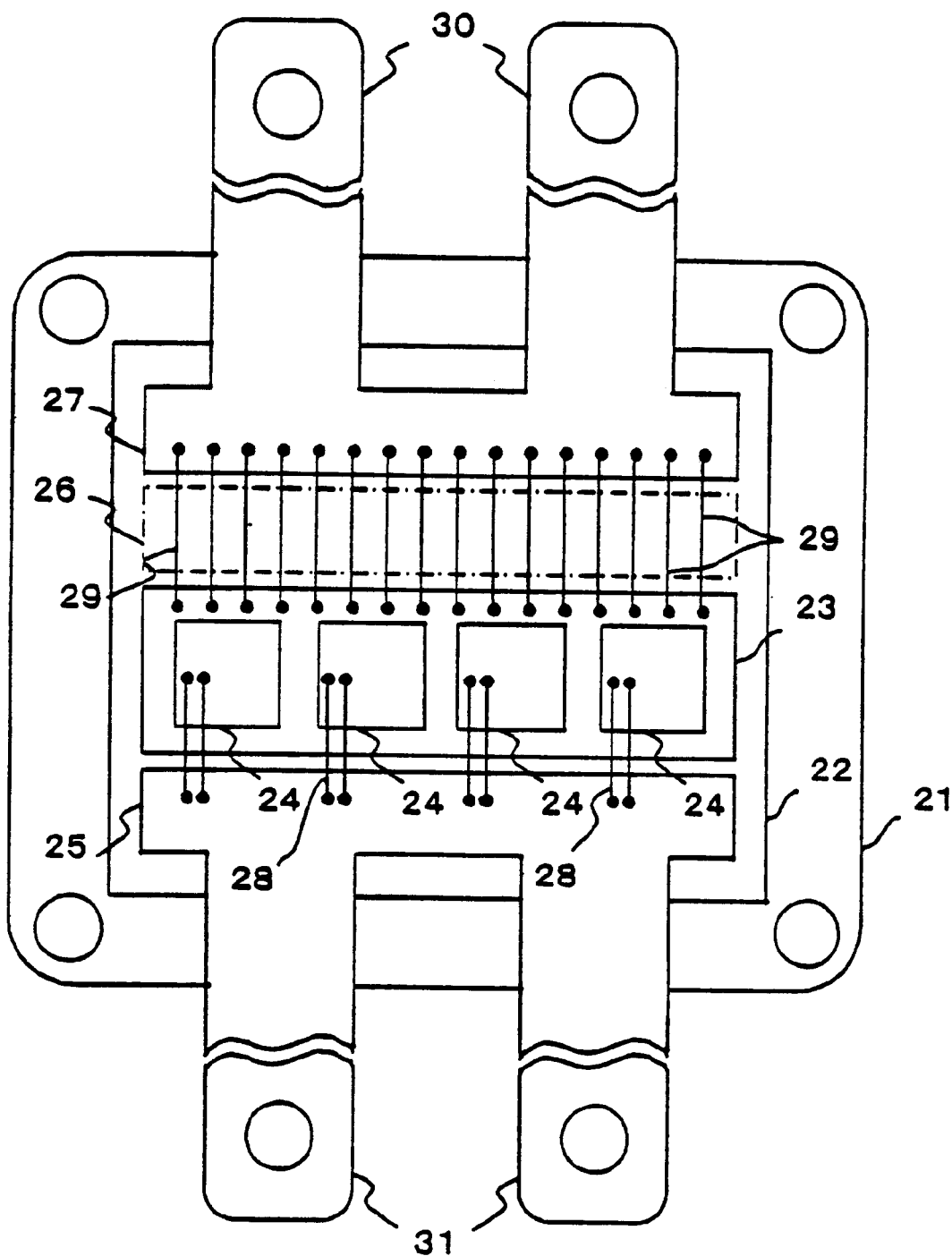
FIG. 3 is a plan view of the power semiconductor module according to the first embodiment of the present invention.

In the power semiconductor module according to the first embodiment of the present invention shown in FIG. 3, an insulated substrate 22 comprising ceramic insulator, etc. is mounted on a base plate 21 for fixing as in the configuration of the conventional technology shown in FIG. 1. On the insulated substrate 22, a plurality of (four in FIG. 4) semiconductor devices (semiconductor chips) 24 are mounted in an array through a conductive plate (conductive layer) 23 made of a conductive material such as copper, etc. In this example, the semiconductor device 24 is a MOSFET having a source electrode and a gate electrode on the top side, and a drain electrode on the reverse side. The conductive plate 23 is electrically connected commonly to the drain electrode of each semiconductor device 24 by mounting the semiconductor device 24 directly on it.

On the insulated substrate 22, a source electrode (the second main current electrode) 25 and a gate electrode 26 of the entire module are mounted along the array of the semiconductor devices 24 and on either side of the conductive plate 23 on which the semiconductor devices 24 are mounted. Furthermore, on the insulated substrate 22, a drain electrode (the first main current electrode) 27 of the entire module is mounted with a gate electrode 26 opposite the source electrode 25 through the conductive plate 23. These electrodes are made of a conductive material such as copper, etc. Since the gate electrode 26 is not a very important element of the present invention, only its outline is briefly drawn by the dot-and-dash line for simple expression of the figure.

The source electrode 25 is electrically connected commonly to the source electrode of each semiconductor device 24 through a wire (bonding wire) 28. The gate electrode 26 is electrically connected commonly to the gate electrode of each semiconductor device 24 through a wire as shown in FIG. 1.

The drain electrode 27 is connected to the conductive plate 23 over the gate electrode 26 through a plurality of wires 29 equally arranged at predetermined distances along the array of the semiconductor devices 24. Thus, the drain electrode 27 is commonly connected to each semiconductor device 24 through the wire 29 and the conductive plate 23. The length of each wire 29 is set the shortest possible but long enough to connect the conductive plate 23 to the drain electrode 27 over the gate electrode 26. That is, the conductive plate 23 is connected to the drain electrode 27 straight (on the plan view) at the shortest possible distance.

In this case, since the gate electrode 26 exists between the drain electrode 27 and the conductive plate 23, the wiring of the wire 29 is designed not to interfere with the wire connecting the gate electrode 26 to each semiconductor device 24.

Two drain terminals 30 are led as the first external terminals outside the module from the drain electrode 27. Two source terminals 31 are led as the second external terminals outside from the source electrode 25. The drain terminal 30 and the source terminal 31 are set opposite each other on either side of the conductive plate 23 which is a mounting area of the semiconductor device 24. A gate terminal 34 is led outside from the gate electrode 28.

Although not shown in the attached drawings, a gate terminal is led outside from the module. However, if the gate terminal can interfere with the wire 29, then the gate terminal is led from an appropriate point, or the wiring of the wire 29 is to be a little changed.

Although not shown in the attached drawings, the entire module is normally put in a resin package, and the space in the package is filled with gel or epoxy resin, etc. The above mentioned external terminal is drawn in a two-dimensional array in the figure, but it is appropriately bent and exposed on the top or side of the package.

The semiconductor module with the above mentioned configuration has a plurality of semiconductor devices 24 connected in parallel between the drain terminal 30 and the source terminal 31. Therefore, in principle, the main current flowing between the drain terminal 30 and the source terminal 31 can be controlled by applying a control voltage between the gate terminal and the source terminal 31, and simultaneously setting all semiconductor devices 24 ON/OFF.

According to the present embodiment, since the drain electrode 27 is connected to the conductive plate 23 through the wires 29 arranged equally at predetermined distances along the array of the semiconductor devices 24, the structure is substantially equal to the structure obtained by directly connecting the drain electrode 27 to the conductive plate 23 on their sides (along the above mentioned array). Therefore, the main current flows substantially straight from the drain electrode 27 to each semiconductor device 24 through the conductive plate 23, and then to the source electrode 25. Since the drain terminal 30 is opposite the source terminal 31, the main current flows substantially straight from the drain terminal 30 to the source terminal 31 at the shortest distance.

Thus, since the current path of the main current can be formed substantially straight from the drain terminal 30 to the source terminal 31, the current path can be considerably shorter. As a result, the inductance can be reduced and the surge voltage can be suppressed, thereby enhancing the reliability of the module.

Since the lengths of the current paths can be leveled in the module, almost regardless of the arrangement of each semiconductor device 24, the wiring resistance in each current path can be uniform. As a result, a current does not excessively flow only through a part of the semiconductor devices, thereby leveling the values of the main current flowing through the semiconductor devices 24, and increasing the maximum current in the entire module.

Furthermore, since the drain electrode 27 is not directly connected to the conductive plate 23, but they are indirectly connected through the wires 29, the problem of cracks with the conventional technology can be effectively avoided although the semiconductor devices 24 repeats expansion and contraction by their heat.

Second Embodiment of the Present Invention

Figure 4:
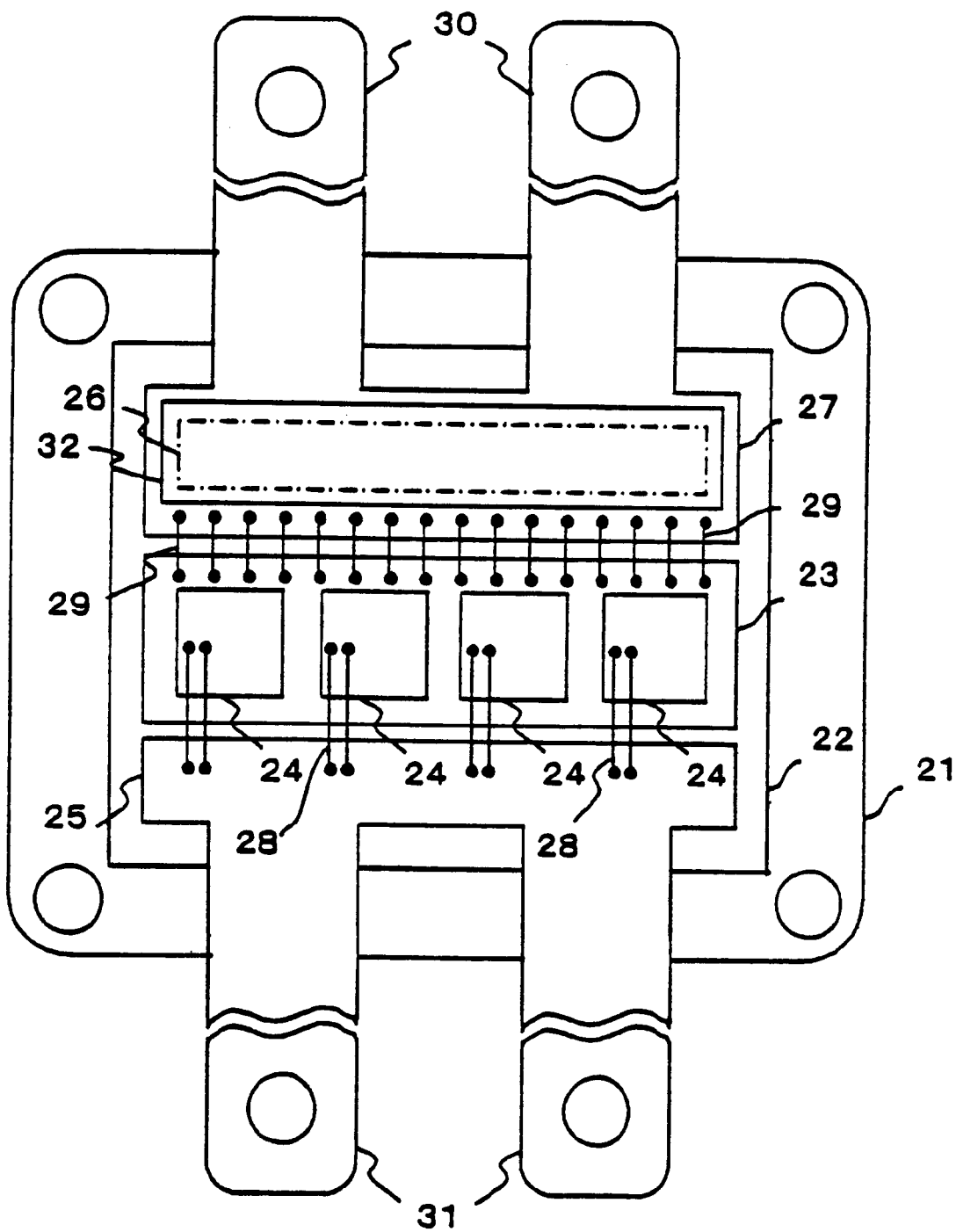
FIG. 4 is a plan view of the power semiconductor module according to the second embodiment of the present invention.

In the power semiconductor module according to the second embodiment of the present invention shown in FIG. 4, the drain electrode 27 and the gate electrode 26 are not mounted on the insulated substrate 22, but the gate electrode 26 is mounted on the drain electrode 27 through an insulating plate (insulating layer) 32. In this case, the drain electrode 27 has an area on which the gate electrode 26 is mounted, and a very small area for connection of the wire 29. Since other configuration is the same as that according to the first embodiment, the detailed explanation is omitted here.

Also in this second embodiment of the present invention, the following unique effect can be obtained in addition to the similar effects as the above mentioned first embodiment.

That is, since no gate electrode 26 exists between the drain electrode 27 and the conductive plate 23, the drain electrode 27 can be set the closer to the conductive plate 23. As a result, a smaller module can be produced. Furthermore, since the wire 29 connecting the drain electrode 27 to the conductive plate 23 can be shorter, the inductance can be further reduced.

Additionally, since the wire connecting the gate electrode 26 with each semiconductor device 24 is applied over the wire 29, the wires hardly interfere with each other. Therefore, the wire 29 can be set for a compact structure, and the wire bonding operation can be easily performed.

Other Embodiments

The present invention is not limited to the above mentioned embodiments, but can devise various configurations in the scope disclosed by the claims. For example, the following configuration can be adopted.

(1) In the above mentioned embodiments, the drain electrode 27 is connected to the conductive plate 23 through the wires 29 set at equal distances. But they do not necessarily have to be set at equal distances, that is, can be uneven in distance. For example, the distances of a part of the wires 29 can be appropriately adjusted to avoid the interference with the wire extended from the gate electrode 26.

Figure 5:
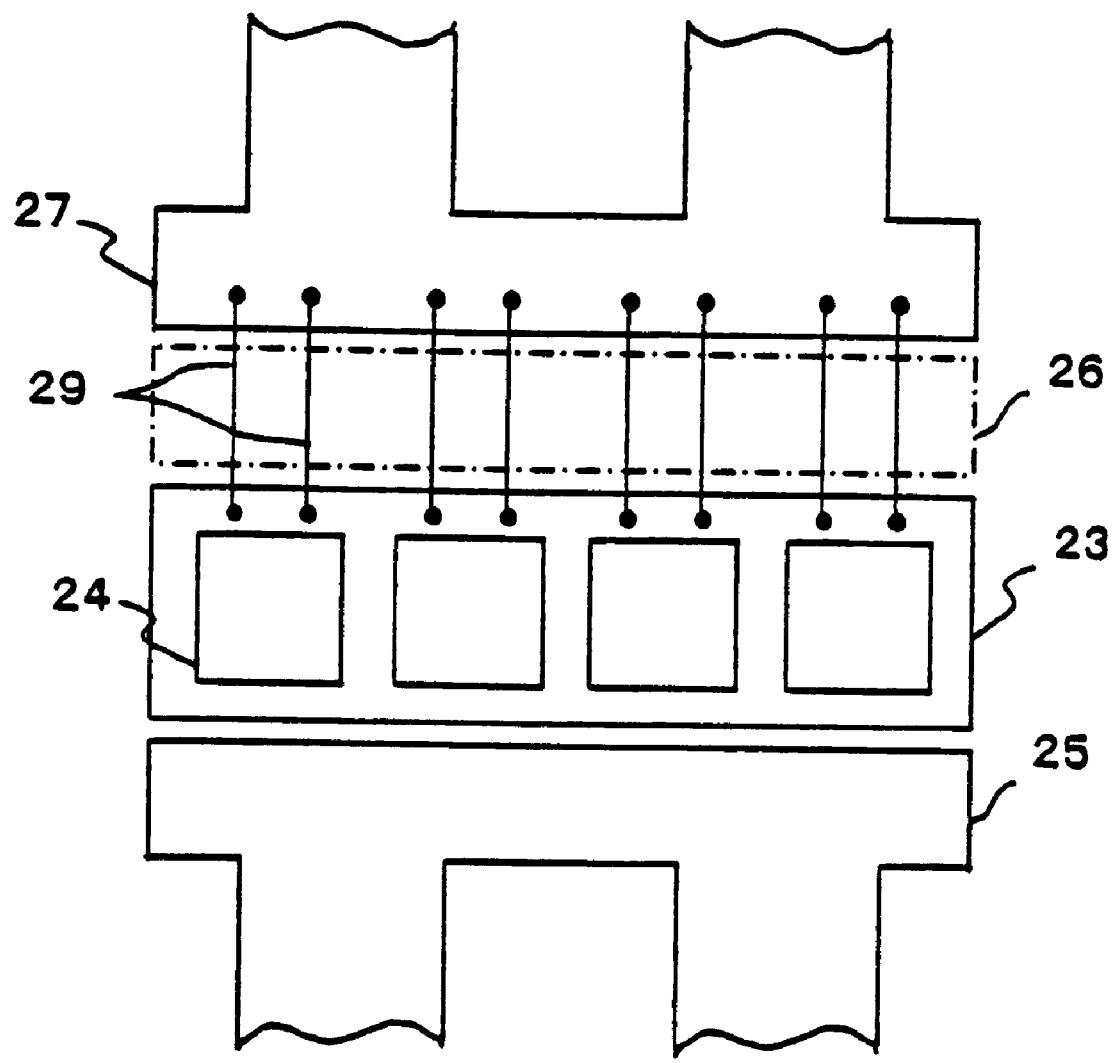
FIG. 5 is a plan view of an important portion of the power semiconductor module according to another embodiment of the present invention.

Otherwise, as shown in FIG. 5, a predetermined number (two in the case shown in FIG. 5) of wires 29 can be set for each of the semiconductor devices 24.

(2) Two units each of the drain terminals 30 and the source terminals 31 are provided, but one unit each can also produce a satisfactory effect. Three or more units each can also be acceptable.

(3) In the above mentioned embodiment, a plurality of semiconductor devices 24 are arranged in an array as an example. That is, two or more arrays of the devices can be applied according to the present invention. The larger number of semiconductor devices, the more outstanding effect of the present invention.

(4) The structure of the substrate on which semiconductor devices are mounted is not limited to the configuration shown in the attached drawings. That is, in FIGS. 3 and 4, the conductive plate 23 is mounted on the insulated substrate 22, and the semiconductor device 24 is mounted on the conductive plate 23. However, according to the present invention, the semiconductor devices can also be mounted directly on the conductive substrate. When such a conductive substrate is adopted, a drain electrode and a source electrode can be mounted on the substrate through an insulating layer.

Furthermore, it is not necessary to mount semiconductor devices and all electrodes on one substrate. That is, the semiconductor device and each electrode can be mounted on different substrates or bases, and then incorporated as a package.

(5) As an external drive terminal, not only the gate terminal is led outside, but a source drive terminal can be branched from the source terminal 31, and be set close to the gate terminal.

Otherwise, a source drive electrode can be mounted next to the gate electrode 26, and the gate terminal and the source terminal can be respectively led outside from the gate electrode and the source electrode.

(6) Not only one semiconductor module has one transistor function, but a plurality of transistor function can be incorporated into one semiconductor module according to the present invention.

(7) In the explanation above, a MOSFET is used as a semiconductor device. However, a semiconductor device can be, for example, a bipolar transistor, a thyristor, an IGBT (insulated gate bipolar transistor), a GTO (gate turn-off thyristor), etc.

As described above, according to the present invention, an electrode wiring structure can be devised to prevent cracks in the structure, and the current path of the main current can be shorter and leveled, thereby reducing the surge voltage, improving the reliability of the apparatus, and increasing the maximum current in the entire apparatus.

What is claimed is:

1. A semiconductor apparatus, comprising:

a plurality of semiconductor devices mounted in one array or more on a substrate;

a first main current electrode mounted along the array(s) of said semiconductor devices, and commonly connected to each of the plurality of semiconductor devices through the substrate;

a second main current electrode mounted along the array (s) of said semiconductor devices opposite said first main current electrode through a mounting area of said semiconductor devices, and commonly connected to each of said plurality of semiconductor devices, wherein said substrate is connected to said first main current electrode through a plurality of wires arranged along the array(s) at equal or substantially equal distances, and wherein a drive electrode commonly connected to each of said plurality of semiconductor devices is mounted on said first main current electrode through an insulating layer.

2. The apparatus according to claim 1, wherein said wires are shortest possible, but long enough to connect said substrate to said first main current electrode.

3. The apparatus according to claim 1, wherein a first external terminal led outside from said first main current electrode and a second external terminal led outside from said second main current electrode are opposite each other through the mounting area of said semiconductor devices.

4. The apparatus according to claim 1, wherein said semiconductor device is a MOSFET (metal oxide semiconductor field-effect transistor), and said first and second main current electrodes are a drain electrode and a source electrode of the MOSFET.

5. A semiconductor apparatus having a plurality of semiconductor devices mounted on a substrate in one array or more, and a main current electrode commonly connected to each of said plurality of semiconductor devices through the substrate, wherein said substrate is connected to said main current electrode through a plurality of wires arranged along the array(s) at equal or substantially equal distances, and wherein a drive electrode commonly connected to each of said plurality of semiconductor devices is mounted on said first main current electrode through an insulating layer.

* * * * *